United States Patent [19]

Lee et al.

[11] Patent Number: 5,418,173
[45] Date of Patent: May 23, 1995

[54] METHOD OF REDUCING IONIC CONTAMINATION IN INTEGRATED CIRCUIT FABRICATION

[75] Inventors: Kuo-Hua Lee, Wescosville; Chen-Hua D. Yu, Allentown, both of Pa.

[73] Assignee: AT&T Corp., Murray Hill, N.J.

[21] Appl. No.: 150,321

[22] Filed: Nov. 9, 1993

Related U.S. Application Data

[63] Continuation of Ser. No. 982,165, Nov. 24, 1992, abandoned.

[51] Int. Cl.6 ............................................. H01L 21/306
[52] U.S. Cl. ..................................... 437/12; 437/228; 437/190; 437/941
[58] Field of Search ................................ 437/228, 941

[56] References Cited

U.S. PATENT DOCUMENTS

| | | | |
|---|---|---|---|
| 3,632,438 | 1/1972 | Carlson et al. | 437/236 |
| 4,590,664 | 5/1986 | Prentice et al. | 437/16 |
| 4,980,301 | 12/1990 | Harrus et al. | 437/12 |
| 4,988,405 | 1/1991 | Martin et al. | 156/657 |
| 5,022,958 | 6/1991 | Favreau | 156/643 |

OTHER PUBLICATIONS

Kern, Werner; The Evolution of Silicon Waft Cleaning Technology, J. Electro-Chem. Soc. vol. 137, No. 6 Jun. 1990.

*Primary Examiner*—Olik Chaudhuri
*Assistant Examiner*—H. Jey Tsai
*Attorney, Agent, or Firm*—John T. Rehberg

[57] ABSTRACT

A method of fabricating integrated circuits is disclosed. A layer of doped silicon dioxide is deposited over a partially fabricated integrated circuit. The doped silicon dioxide is heated to permit it to attract sodium ions. After the doped silicon dioxide has been heated, it is removed by an etching process which exhibits great selectivity to the remaining underlying portion of the integrated circuit.

12 Claims, 1 Drawing Sheet

METHOD OF REDUCING IONIC CONTAMINATION IN INTEGRATED CIRCUIT FABRICATION

This is a continuation of application Ser. No. 07/982,165, filed on Nov. 24, 1992, abandoned.

TECHNICAL FIELD

This invention relates to methods for integrated circuit fabrication.

BACKGROUND OF THE INVENTION

Many processes used in modern integrated circuit fabrication tend to introduce undesirable sodium ions into the integrated circuits which ultimately are formed. For example, processes which utilize photoresist or etchback techniques are typically abundant sources of mobile sodium ions. The mobile sodium ions, once introduced, tend to migrate through the integrated circuit and ultimately degrade circuit performance.

Various doped glass layers are often introduced into integrated circuits by designers to getter sodium ions. Typically, boron and phosphorus dopants are introduced into silicon dioxide layers. The doped silicon dioxide layer tends to attract and hold the sodium ions, thereby preventing them from migrating through the integrated circuit. Thus, the undesirable sodium ions are more or less chemically trapped within doped glass layers within the integrated circuit where they can, hopefully, do no harm elsewhere.

Nevertheless, there remains a continuing need for better methods of dealing with the presence of sodium ions in integrated circuits.

SUMMARY OF THE INVENTION

The present invention provides a method for coping with the mobile sodium ion problem. Illustratively, when a process is performed upon a semiconductor substrate which tends to introduce sodium, a material layer which attracts sodium is formed over the substrate. A substantial portion of the material layer is then removed and then the formation of integrated circuits is completed. Illustratively, the material layer is BPTEOS which has been heated to attract sodium ions from underlying layers, including layers(s) of TEOS. The BPTEOS (together with its undesirable gettered sodium) may then be removed by a wet etching process.

DETAILED DESCRIPTION

Figure 1:
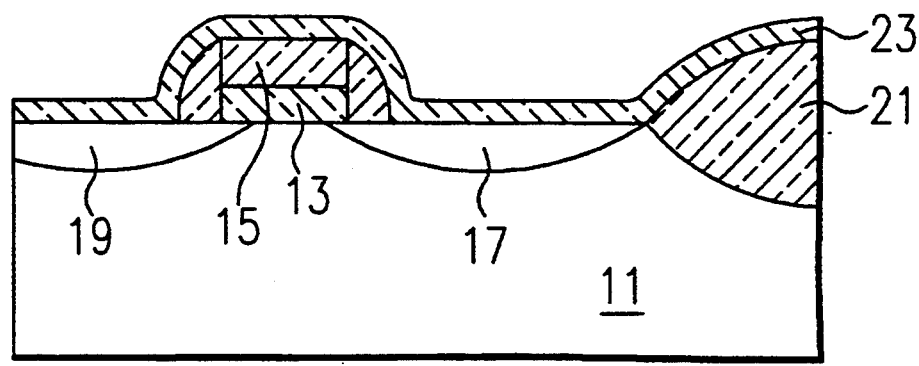
FIGS. 1, 2, and 3 are cross-sectional views of an integrated circuit which may be helpful in understanding an embodiment of the present invention.

In FIG. 1, reference numeral 11 denotes a substrate which may be, typically, silicon, doped silicon, epitaxial silicon, etc. In general, the term substrate refers to a material or layer upon which other materials or layers may be formed. Reference numeral 13 denotes a gate dielectric; reference numeral 15 denotes a gate conductor. Conductor 15 may typically be polysilicon. Conductor 15 may have an optional overlying silicide layer desired. Junctions 17 and 19 represent the source and drain of a transistor. Reference numeral 21 denotes a field oxide. Reference numeral 23 is a dielectric which is typically silicon dioxide. Dielectric 23 may be formed by deposition from TEOS, silane, or a variety of other precursors.

After dielectric 23 is formed, a variety of processes may be performed upon it. For example, etchback procedures which smooth the surface topography, possibly involving the use of photoresist, and the opening of vias or windows may be performed. Such procedures tend to introduce undesirable sodium ions.

Figure 2:
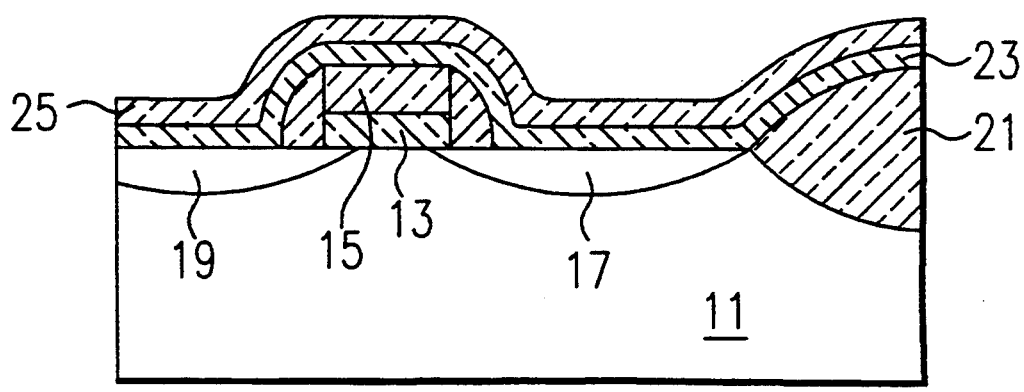

Turning to FIG. 2, a second (ultimately disposable) dielectric layer 25 is formed atop dielectric 23. Desirably, layer 25 is formed from TEOS doped with boron and phosphorus. Typically, 4.5%±1% boron and 4.5%±1% phosphorus may be employed. Layer 25 typically formed from boron and phosphorus doped TEOS is often termed BPTEOS. After layer 25 has been formed, it is annealed at approximately 800° C. The annealing process tends to attract sodium ions which have been previously introduced into underlying dielectric 23. (During the annealing, the BPTEOS flows, making its upper surface smoother.)

After the annealing process has been completed, layer 25 is either substantially or completely removed. The removal of layer 25 also effects the removal of the undesirable sodium ions. If layer 25 is made from BPTEOS and layer 23 is made from TEOS or PETEOS (plasma enhanded TEOS), layer 25 may be removed using an etching process sometimes termed an "AP cook." Layer 25 is removed utilizing $NH_4OH/H_2O_2$. The preferred formula is eight parts $H_2O$, two parts $H_2O_2$ (30% con.) and one part concentrated $NH_4OH$ and the preferred temperature is at 85° C. The AP cook etch exhibits great selectivity to underlying undoped oxides, such as silicon dioxide formed by thermal oxidation or from TEOS or from plasma enhanced TEOS (PETEOS) or from other precursors.

Should it be desired, some small portions of dielectric 25 may be permitted to remain upon dielectric 23 in the corners. For example, turning to FIG. 3, gates 113 and 114 are closely spaced together over dielectric 11. Dielectric 23 covers gates 113 and 114. After the annealing of dielectric 25, the AP cook is performed for a slightly shorter time, permitting residuals of dielectric 25, namely 251, 252, and 253 to remain upon dielectric 23. The residuals of dielectric 25 help to provide additional topographic smoothing. (The sodium remains trapped within 251, 252, and 253.)

Figure 3:
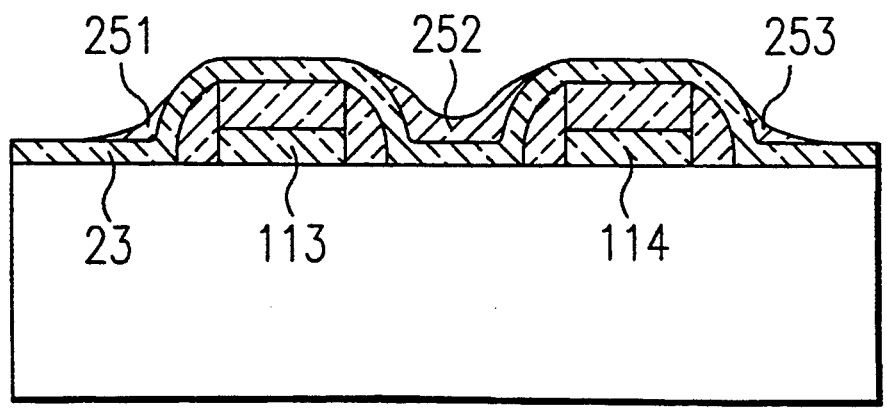

Although FIGS. 1, 2, and 3 have depicted a process which removes sodium at the gate level, the invention is not so limited. The process may also be used at higher levels in integrated circuit fabrication. Furthermore, the process may be used more than once in the fabrication of a particular integrated circuit.

We claim:

1. A method of semiconductor integrated circuit fabrication comprising:
    forming a gate upon a semiconductor substrate;
    forming a dielectric layer upon said gate and upon said substrate, performing a process which tends to introduce sodium into said dielectric;
    forming a material layer in contact with said dielectric, said material layer tending to attract sodium;
    removing said material layer from that portion of said dielectric over said gate, fillets of said material remaining adjacent said gate.

2. A method of integrated circuit fabrication comprising:
    forming a gate upon a semiconductor substrate;

forming more than one dielectric layer upon said gate and upon said substrate;

performing a process which tends to introduce sodium into at least one of said dielectric layers;

forming a material layer in contact with one of said dielectric layers; said material layer tending to attract sodium;

removing said material layer, with fillets of said material remaining in contact with said dielectric.

3. The method of claim 1 in which said process which tends to introduce sodium is the opening of a via.

4. The method of claim 1 in which said process which tends to introduce sodium in a resist etchback.

5. The method of claim 2 in which said process which tends to introduce sodium is the opening-of a via.

6. The method of claim 2 in which said process which tends to introduce sodium in a resist etchback.

7. The method of claim 1 in which said dielectric is silicon dioxide.

8. The method of claim 1 in which said dielectric is silicon dioxide formed from TEOS.

9. The method of claim 1 in which said material layer is formed from BPTEOS and said material layer is annealed to attract sodium ions.

10. The method of claim 2 in which said dielectric is silicon dioxide.

11. The method of claim 2 in which said dielectric is silicon dioxide formed from TEOS.

12. The method of claim 2 in which said material layer is formed from BPTEOS and said material layer is annealed to attract sodium ions.

* * * * *